United States Patent [19]
Sado et al.

[11] 4,053,753
[45] Oct. 11, 1977

[54] ELECTRONIC CALCULATOR WITH FUNCTION KEYS

[75] Inventors: Ichiro Sado; Juji Kishimoto, both of Tokyo; Seiji Saito, Yokohama; Atsushi Sakurai, Tokyo, all of Japan

[73] Assignee: Canon Kabushiki Kaisha, Tokyo, Japan

[21] Appl. No.: 668,803

[22] Filed: Mar. 19, 1976

[30] Foreign Application Priority Data

Mar. 28, 1975 Japan .................................. 50-37498
Feb. 24, 1976 Japan .................................. 51-19133

[51] Int. Cl.² .............................................. G06F 7/38
[52] U.S. Cl. ................................................ 364/709
[58] Field of Search ................ 235/156, 160, 159, 164

[56] References Cited

U.S. PATENT DOCUMENTS

| | | | |
|---|---|---|---|
| 3,760,171 | 9/1973 | An Wang et al. | 235/156 |
| 3,839,630 | 10/1974 | Olander, Jr. et al. | 235/156 |
| 3,902,054 | 8/1975 | Cochran et al. | 235/156 |
| 3,971,925 | 7/1976 | Wenninger et al. | 235/156 |

OTHER PUBLICATIONS

*PDP-8/E & PDP-8/M Small Computer Handbook,* 1972, Digital Equipment Corp. 1971, pp. 2-5 thru 2-7.
*Programming Languages,* Digital Equipment Corp., 1972, pp. 12-6, 12-34, 12-35, 12-57 & 12-58.

*Primary Examiner*—David H. Malzahn
*Attorney, Agent, or Firm*—Fitzpatrick, Cella, Harper & Scinto

[57] ABSTRACT

In an electronic desk-top calculator, there are provided input means including at least one function key, a plurality of arithmetical operation keys and a plurality of numeric keys, and means for effecting functional operation by depression of the function key, one of the numeric keys and one of said arithmetic operation keys, in such order.

4 Claims, 8 Drawing Figures

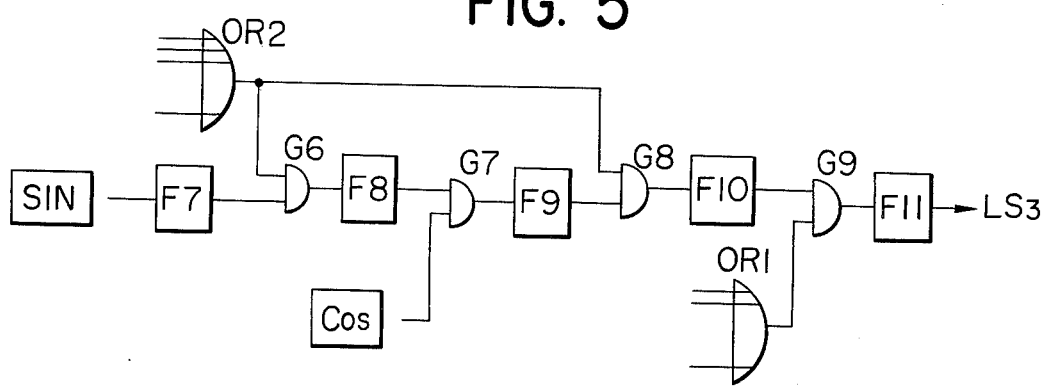
FIG. 5
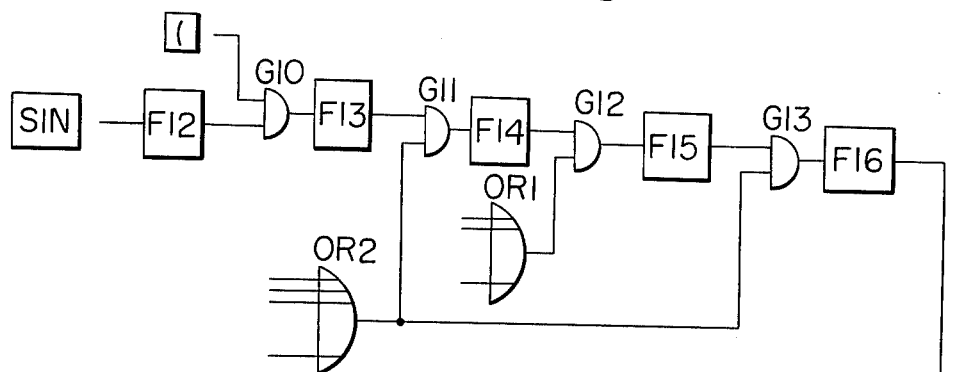
FIG. 6
FIG. 7
FIG. 8
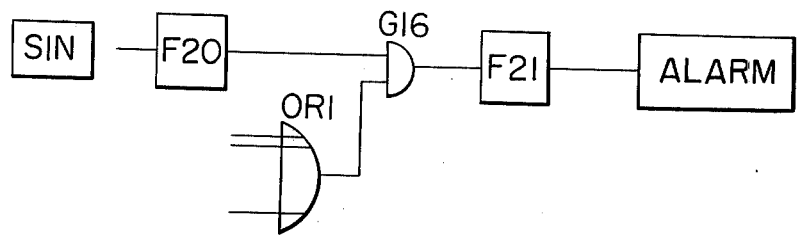

ELECTRONIC CALCULATOR WITH FUNCTION KEYS

BACKGROUND OF THE INVENTION

1. Field of the Invention

This invention relates to an electronic desk-top calculator.

2. Description of the Prior Art

In conventional desk-top calculators, the order of key inputs entered for the calculation of a functional expression (for example, SIN 30°) has generally consisted of first entering numeric data, and then depressing a function key.

On the other hand, in the arithmetical operations (+, −, ×, ÷, =, etc.), it has been common practice to enter key inputs in the same order as the expression to be calculated. This has often caused confusion to the operator when an expression containing a function or functions is to be entered.

SUMMARY OF THE INVENTION

The present invention intends to overcome the above-noted contradiction and provides a very simple operation system.

According to the present invention, an electronic desk-top calculator is provided with means for effecting functional operation in response to key inputs which follow the order of the particular functional expression. The calculator may further include means for providing an alarm when the key inputs do not follow the order of the functional expression.

The invention will become more fully apparent from the following detailed description of some embodiments thereof taken in conjunction with the accompanying drawings.

DESCRIPTION OF THE PREFERRED EMBODIMENTS

Figure 1:
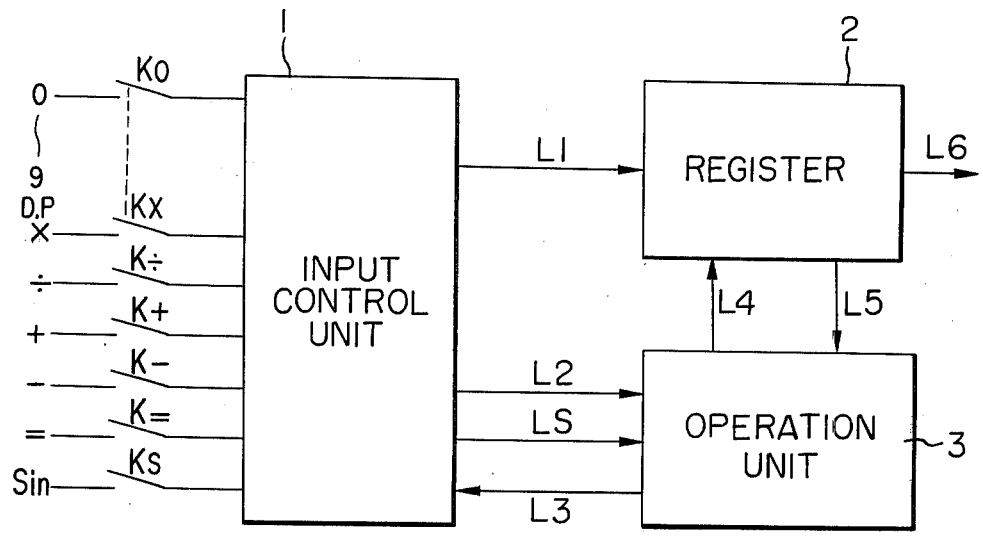
FIG. 1 is a basic block diagram of the present invention.

Referring to FIG. 1, which is a basic block diagram of the present invention, reference numeral 1 designates a key input control unit which encodes key inputs by means of an encoder or the like, and which transmits the key codes to a register unit 2 through a line L1 for numeric keyed data and transmits the key codes to an operation unit 3 through a line L2 for keyed-in operands. A line L3 is provided for passing a timing signal delivered from the operation unit and for controlling the signal outputs on the lines L1 and L2 in accordance with the timing signal. A line L4 is provided for passing an instruction from the operation unit to the register, a line L5 is for passing, for example, "carry" or similar signals from the register to the operation unit, and a line L6 is an output line for effecting either the display or the printing of the content of the register 2.

Figure 2:
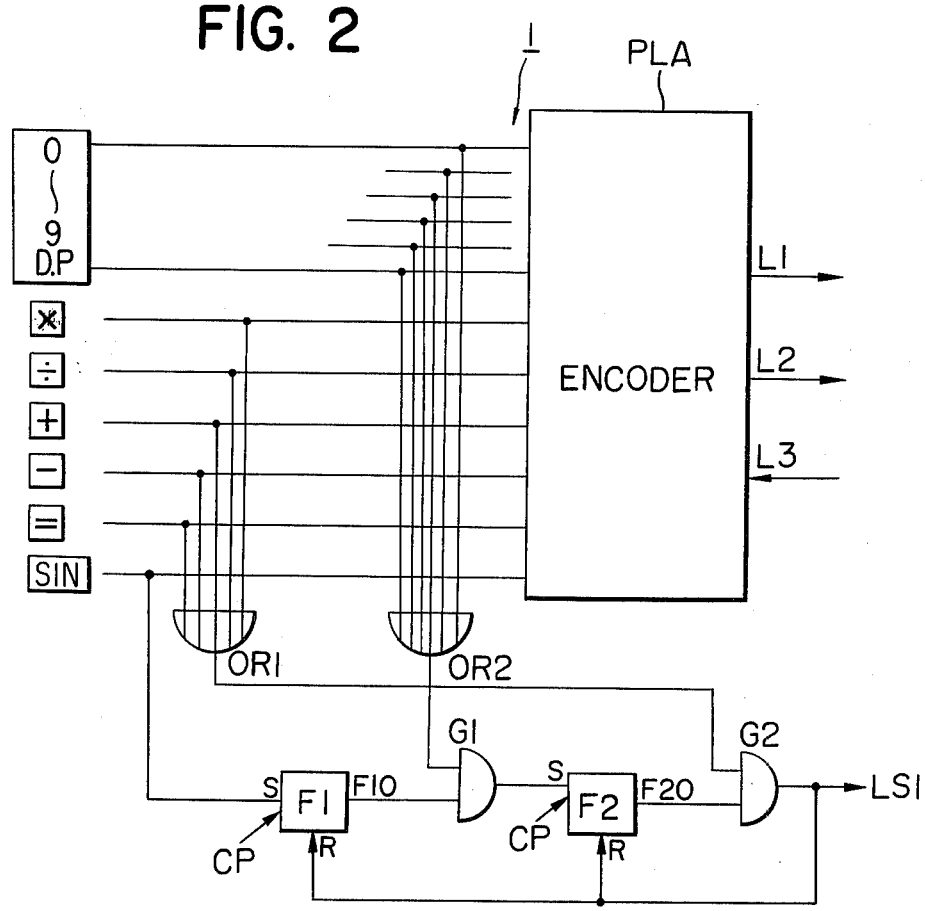
FIG. 2 is a detailed view of a portion of FIG. 1.

FIG. 2 shows details of the key input control unit shown in FIG. 1. Designated by PLA is an encoder which operates to sense and encode key inputs. OR1 is an OR gate for providing a logical sum of the keys ×, ÷, +, − and =,. OR2 is an OR gate for providing a logical sum of numeric keys 0–9 and decimal point key DP. A flip-flop F1 is set by the first falling of the clock pulse generated upon depression of SIN key.

Assuming that the output of the flip-flop F1 is F10, G1 is the AND gate for producing the logical product of F10 and OR2 and thus, the output of G1 provides the set signal for the flip-flop F2. Assuming that the output of the flip-flop F2 is F20, and G2 is an AND gate for producing the logical product of F20 and OR1, then 1, the output of G2 provides the reset signal for F1 and F2 (reset takes place by the falling of the clock pulse when the reset equals 1) and is applied to the operation unit 3 through a line $LS_1$.

Figure 3:
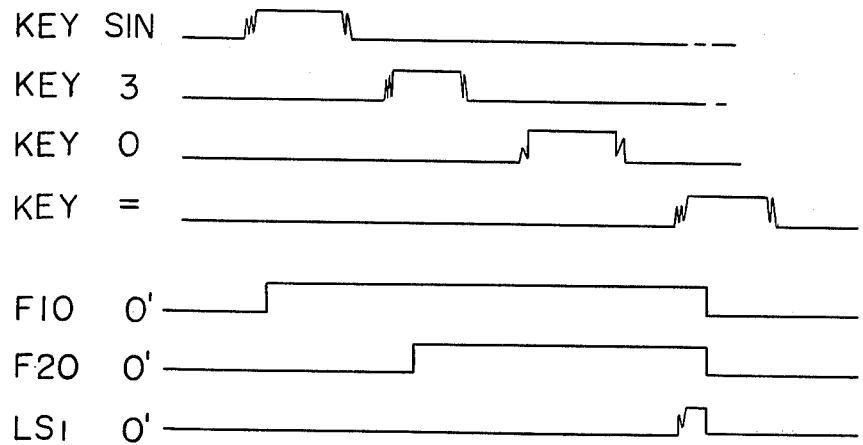
FIG. 3 is a timing chart for illustrating the operation of the FIG. 2 portion.

FIG. 3 is a timing chart for illustrating the operation taking place when keys SIN, 3, 0 and = are depressed in the named order in the above-described construction. F1 is set by depression of the function key, in this example the SIN key, and then F2 is also set by depression of the numeric keys. Next, upon depression of the arithmetical operation key = G2 is opened to provide a 1 signal on the line $LS_1$ while F1 and F2 are reset by the falling of the clock pulse. This will be explained with respect to the procedure of the operation as viewed on the part of the operation unit 3. When the SIN key is depressed, the operation unit does nothing but to receive the key code and the next digits 3 and 0 are stored in the form of "30" within the register in the register unit 2. Subsequently, upon reception of the key code in response to depression of the = key, the operation unit 3 discriminates between the presence and absence of a signal on the line $LS_1$ and if the signal is 1, a SIN function generator (subroutine) prepared within the operation unit 3 is operated to calculate the SIN of the number 30 stored in the register, whereafter the result (0.5) is stored in an output register within the register unit 2 for either display or printing. In addition to the foregoing example of an expression, a different expression such as SIN 30 × 2 = may also be obtained by calculating the result of SIN 30° by the use of the × key, and then by executing 0.5 × 2 by depressing the 2 and the = keys.

For the keys COS, TAN, LOG, etc., similar effects may easily be realized by using similar constructions.

Figure 4:
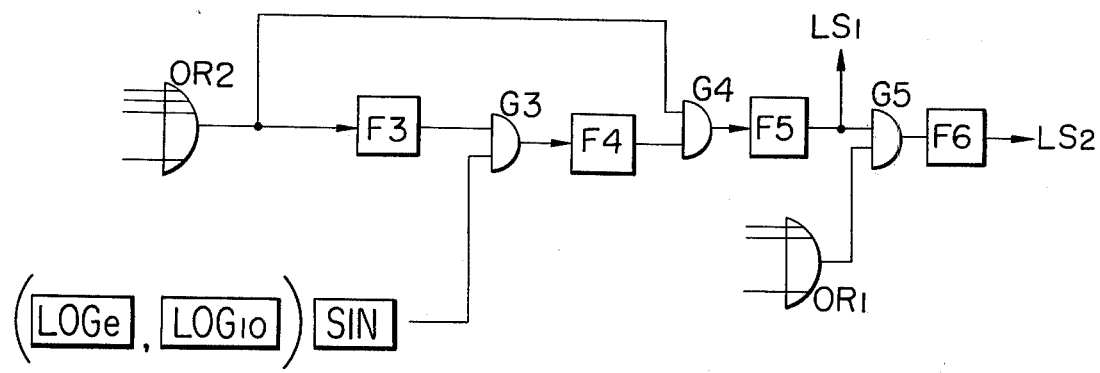
FIGS. 4 to 7 show further forms of the FIG. 2 portion.
Figure 1:
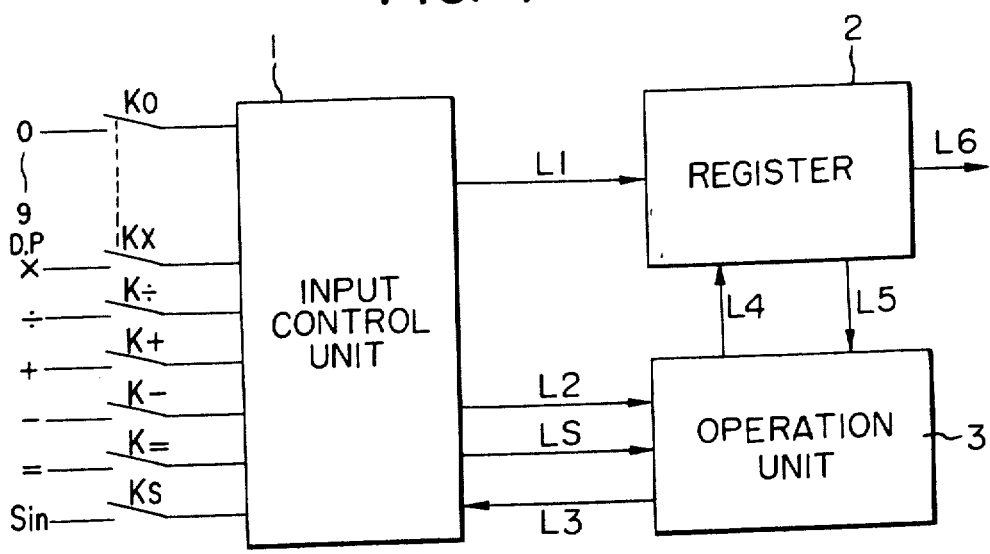
Figure 2:
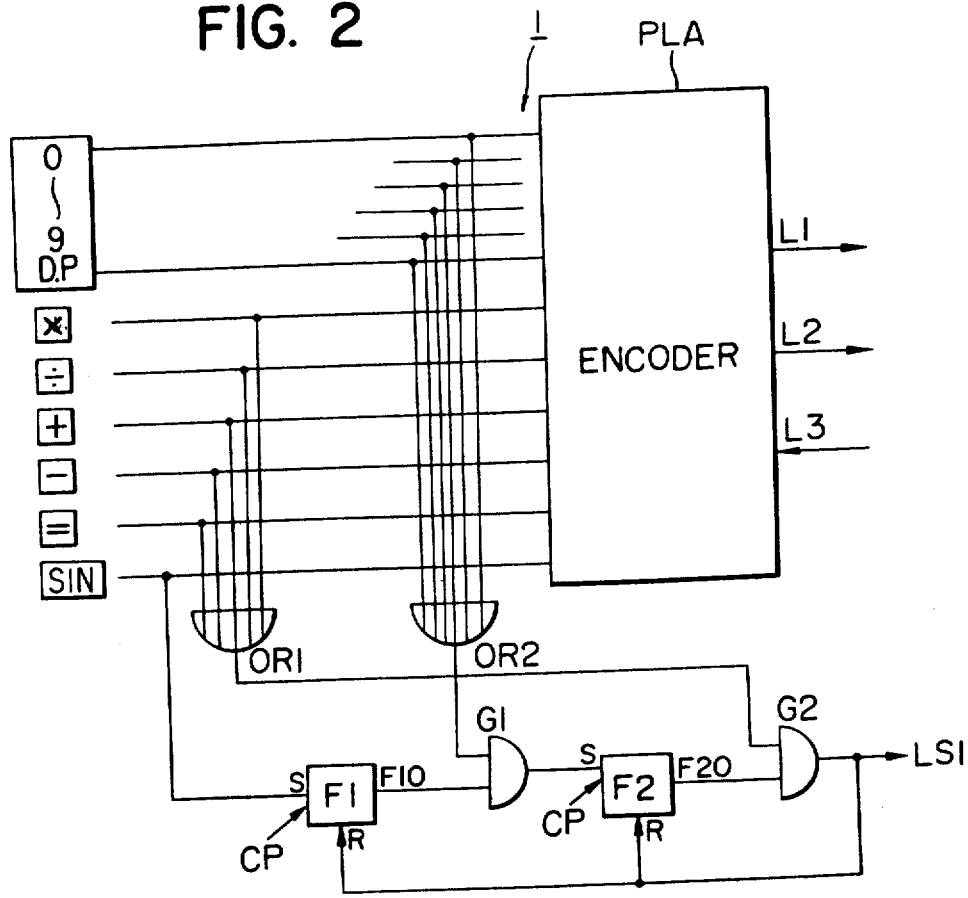
Figure 3:
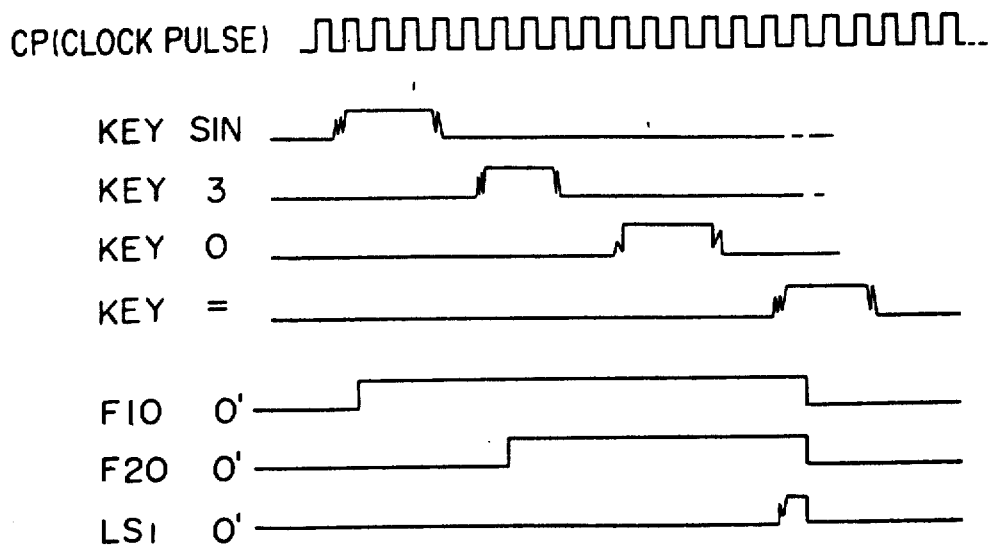
Figure 4:
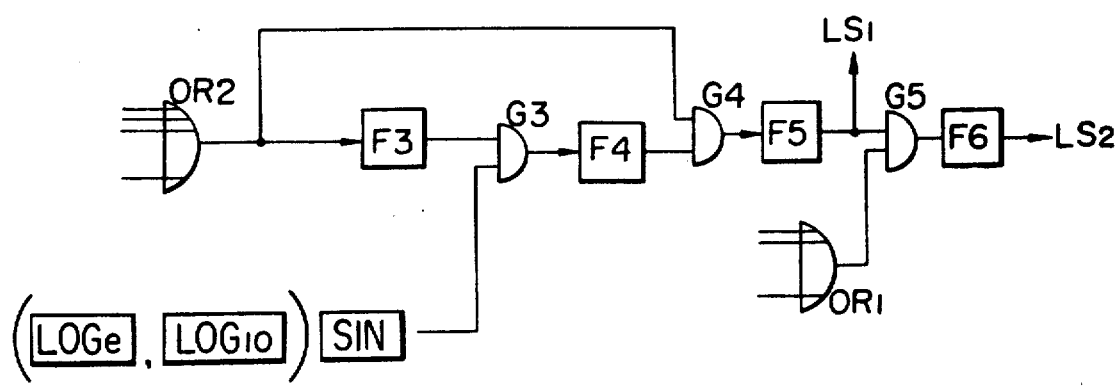

Referring to FIG. 4 to calculate 2 sin 30, 2 SIN 30 = may be entered from the keyboard in the named order, whereby flip-flops F3, F4, F5 and F6 may be set in that order by a circuit shown in the figure, as in the case of FIG. 2. The set signal of F6 is produced on an output line $LS_2$ and is introduced into the operation unit 3, where the operation is effected with said function to obtain the answer. Since, in this case, the set output of the flip-flop F5 is substantially equal to the output signal on the line $LS_1$ of FIG. 2, the sin function subroutine may be performed by the set output of F5 and the result may be obtained by the output signal on the line $LS_2$. Such operation may be accomplished by any of various well-known techniques and need not be described herein. It is apparent that the circuit of FIG. 4 may also easily perform such an expression as 3 $Log_{10}$ 42 by effecting key inputs in the order of 3 $LOG_{10}$ 42 = which directly follows the expression.

Figure 5:
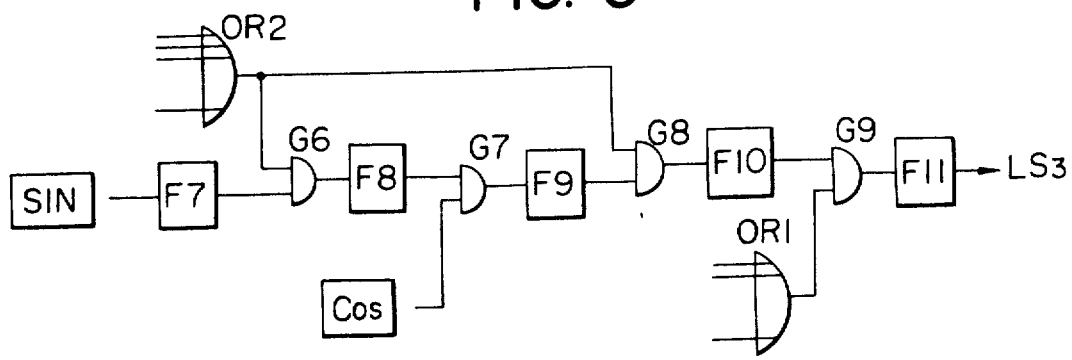
Figure 6:
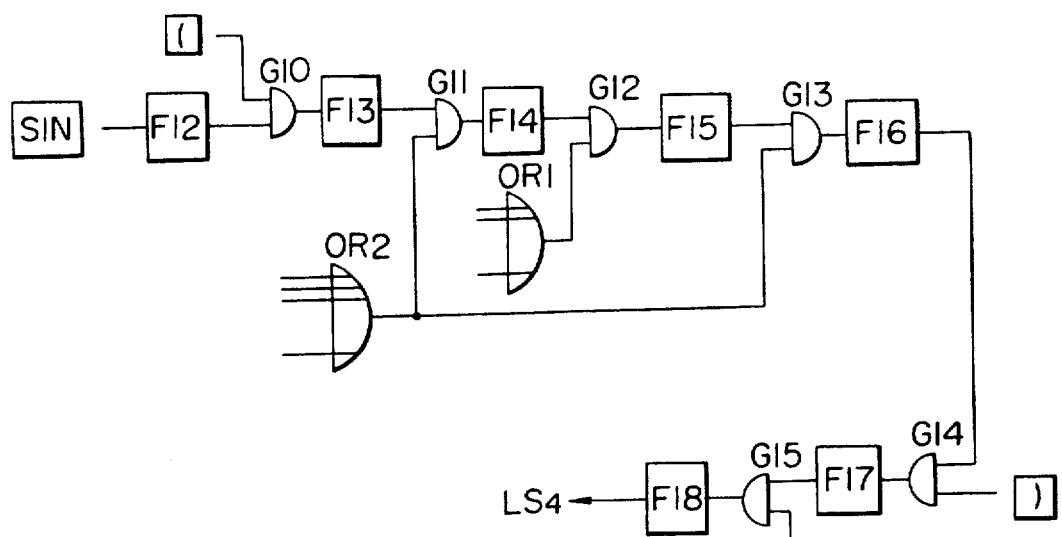

FIG. 5 shows a circuit example for calculating sin 30 cos 45, etc. and FIG. 6 shows a circuit example for calculating sin (31 + 42), etc. These are substantially similar in operation.

Figure 7:
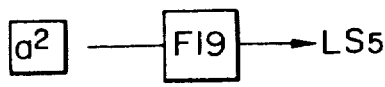
Figure 8:
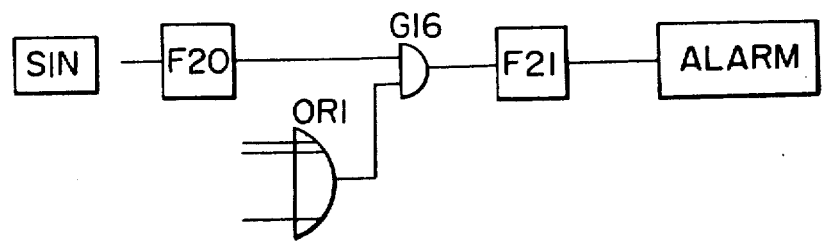
FIG. 8 shows a form of alarm means.

FIG. 7 shows a circuit example in which, for the calculation of sin[2] 30 or the like, key inputs are effected as in the order of SIN 2 $a^2$ 30 = and output signals on lines $LS_1$ and $LS_5$ are combined together, the result of which may be obtained in the operation circuit 3. The operator, if he was fully accustomed to the previously described conventional input system, for example, the habit of entering 30 SIN = for sin 30, would often depress one of operation keys ×, ÷, +, −, etc., instead of a numeric key, immediately after the depression of the trigonometric function key, for example, in the order of SIN ×. For such cases, alarm means ALARM in FIG. 8, operable in response to depressions of SIN ×, may conveniently be provided to make the operator aware of his own error. This will advantageously help the operator to quickly comprehend the key input system embodied in the present invention.

We claim:

1. An electronic calculator comprising:
    a plurality of numeric keys operative to enter signals corresponding to selected numerical data;
    a plurality of operation keys operative to enter signals corresponding to selected arithmetic operations;
    at least one function key operative to select a predetermined computation to be performed on data entered by said numeric keys;
    a result key operative to instruct computation of expressions entered by selective actuation of said numeric, said operation and said function keys;
    input control means coupled to each of said numeric keys, said operation keys, said at least one function key and said result key, for producing control signals in response to actuation of corresponding ones of said keys, said control means comprising a first memory means operative to store a first control signal produced in response to actuation of said at least one function key, a second memory means coupled to the first memory means and operative to store a second control signal produced in response to actuation of a selected one of said numeric keys only when said first control signal is stored in said first memory means, and signal generating means coupled to said second memory means for producing a command signal operative to enable said predetermined computation in response to actuation of either one of said operation keys and said result key only when said second control signal is stored in said second memory element wherein said command signal is generated only if said numeric keys are actuated next following an actuation of said at least one function key; and
    arithmetic operation means coupled to said input control means for performing said predetermined computation and for producing a corresponding display output signal in response to the command signal from said input control means.

2. An electronic calculator according to claim 1, further comprising alarm means coupled to said input control means for producing an alarm signal when said at least one function key is actuated out of a predetermined order.

3. An electronic calculator comprising:
    a plurality of numeric keys operative to enter signals corresponding to selected numerical data;
    a plurality of operation keys operative to enter signals corresponding to selected arithmetic operations;
    at least one function key operative to select a predetermined computation to be performed on data entered by said numeric keys;
    a result key operative to instruct computation of expressions entered by selective actuation of said numeric, said operation and said function keys;
    input control means coupled to each of said numeric keys, said operation keys, said at least one function key and said result key, for producing control signals in response to actuation of corresponding ones of said keys, said control means comprising first OR gate means having inputs coupled to said operation keys and said result key, a first flip-flop operative to store a first control signal produced in response to actuation of said at least one function key, second OR gate means having inputs coupled to said numeric keys, first AND gate means having inputs coupled to the outputs of said second OR gate means and said first flip-flop, respectively, a second flip-flop having a set terminal coupled to the output said first AND gate means, and second AND gate means having inputs coupled to the outputs of said second flip-flop and said first OR gate means, respectively, wherein a command signal operative to enable said predetermined computation is produced at the output of said second AND gate means in response to actuation of either one of said operation keys and said result key only when said second flip-flop is set; and
    arithmetic operation means coupled to said input control means for performing said predetermined computation and for producing a corresponding display output signal in response to the command signal from said input control means.

4. An electronic calculator according to Claim 3, further comprising alarm means coupled to said input control means for producing an alarm signal when said at least one function key is actuated out of a predetermined order.

* * * * *

UNITED STATES PATENT OFFICE
CERTIFICATE OF CORRECTION

Patent No. 4,053,753  Dated October 11, 1977

Inventor(s) Ichiro Sado et al.

It is certified that error appears in the above-identified patent and that said Letters Patent are hereby corrected as shown below:

In the Grant Only, delete all of the drawing figures and substitute the drawing as shown on the attached sheets.

Signed and Sealed this

Twenty-first Day of March 1978

[SEAL]

Attest:

RUTH C. MASON
Attesting Officer

LUTRELLE F. PARKER
Acting Commissioner of Patents and Trademarks